(12) United States Patent
Zhou

(10) Patent No.: US 9,780,272 B2
(45) Date of Patent: Oct. 3, 2017

(54) LIGHT-EMITTING DIODE AND METHOD FOR MANUFACTURING LIGHT-EMITTING DIODE

(71) Applicant: Shenzhen China Star Optoelectronics Technology Co., Ltd., Shenzhen, Guangdong (CN)

(72) Inventor: Gege Zhou, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 154 days.

(21) Appl. No.: 14/426,455

(22) PCT Filed: Dec. 12, 2014

(86) PCT No.: PCT/CN2014/093702
§ 371 (c)(1),
(2) Date: Mar. 6, 2015

(87) PCT Pub. No.: WO2016/086446
PCT Pub. Date: Jun. 9, 2016

(65) Prior Publication Data
US 2016/0343923 A1      Nov. 24, 2016

(30) Foreign Application Priority Data
Dec. 2, 2014   (CN) .......................... 2014 1 0723053

(51) Int. Cl.
*H01L 33/00*   (2010.01)
*H01L 27/15*   (2006.01)
(Continued)

(52) U.S. Cl.
CPC ............ *H01L 33/62* (2013.01); *H01L 33/486* (2013.01); *H01L 33/502* (2013.01); *H01L 33/505* (2013.01);
(Continued)

(58) Field of Classification Search
CPC ....... H01L 33/10; H01L 33/405; H01L 33/42; H01L 33/44; H01L 33/50; H01L 33/58; H01L 33/36; H01L 33/48
See application file for complete search history.

(56) References Cited

U.S. PATENT DOCUMENTS 6,954,270 B2 *  10/2005  Ostler ................. G01J 3/10
                                                250/459.1
7,550,319 B2 *  6/2009  Wang .................. C03C 8/02
                                                257/432
(Continued)

FOREIGN PATENT DOCUMENTS

CN        101692448 A  *  4/2010  ........... H01L 33/507

*Primary Examiner* — Mary Wilczewski
*Assistant Examiner* — Tsz Chiu
(74) *Attorney, Agent, or Firm* — Andrew C. Cheng

(57) ABSTRACT

Disclosed are a light-emitting diode and a method for manufacturing a light-emitting diode. The method includes: a base layer; a circuit layer formed on the base layer; a light-emitting chip formed on the circuit layer; electrode pads formed on the base layer and electrically connected to the light-emitting chip so that the electrode pads and the circuit layer and the light-emitting chip are spaced from each other by first spacing distances and the electrode pads and the circuit layer and the light-emitting chip define therebetween first grooves, where an altitude of the electrode pad is equal to an altitude of the light-emitting chip; and a phosphor powder contained package layer formed on the light-emitting chip and the electrode pads and filled into the first grooves between the electrode pads and the circuit layer to form a uniform dome shape.

9 Claims, 4 Drawing Sheets

(51) Int. Cl.
  *H01L 33/62*    (2010.01)
  *H01L 33/54*    (2010.01)
  *H01L 33/50*    (2010.01)
  *H01L 33/56*    (2010.01)
  *H01L 33/48*    (2010.01)

(52) U.S. Cl.
  CPC ............... *H01L 33/54* (2013.01); *H01L 33/56* (2013.01); *H01L 2224/45124* (2013.01); *H01L 2224/45144* (2013.01); *H01L 2224/45147* (2013.01); *H01L 2224/48091* (2013.01); *H01L 2224/48101* (2013.01); *H01L 2933/0066* (2013.01)

(56) References Cited

U.S. PATENT DOCUMENTS

| | | | |
|---|---|---|---|
| 7,714,341 B2* | 5/2010 | Chil Keun | H01L 25/167 257/100 |
| 8,445,928 B2* | 5/2013 | Cheng | H01L 25/0753 257/100 |
| 2004/0065894 A1* | 4/2004 | Hashimoto | H01L 33/642 257/100 |
| 2004/0166234 A1* | 8/2004 | Chua | H01L 33/50 427/64 |
| 2008/0258156 A1* | 10/2008 | Hata | H01L 33/20 257/88 |
| 2009/0023234 A1* | 1/2009 | Hsu | H01L 33/507 438/27 |

* cited by examiner

LIGHT-EMITTING DIODE AND METHOD FOR MANUFACTURING LIGHT-EMITTING DIODE

CROSS REFERENCE TO RELATED APPLICATIONS

This application claims the priority of Chinese Patent Application No. 201410723053.6, entitled "Light-Emitting Diode and Method for Manufacturing Light-Emitting Diode", filed on Dec. 2, 2014, the disclosure of which is incorporated herein by reference in its entirety.

BACKGROUND OF THE INVENTION

1. Field of the Invention

The present invention relates to the field of light source, and in particular to a light-emitting diode and a method for manufacturing a light-emitting diode.

2. The Related Arts

Compared to the traditional light sources, such as incandescent light bulbs and fluorescent lights, a light-emitting diode (LED) has various advantages, such as long lifespan, low power consumption, and high efficiency. Recently, the LEDs have a continuously increased demand and take a leading position in the lighting market.

To allow an LED to emit white light, a package layer of an LED (such as an epoxy resin layer) is coated with red and green phosphor powders. When a blue light chip of the LED emits blue light, the red and green phosphors of the package layer are excited by the blue light to respectively emit red light and green light. The red and green light so generated are mixed with the blue light transmitting through the package layer to thereby form white light.

However, since the shape of the package layer may be irregular. For example, some portions may be thick, while the other portions are thin. Thus, the optic paths through these portions of the package layer are different, leading to non-uniformity of the white light so emitting.

SUMMARY OF THE INVENTION

The technical issue to be addressed in the present invention is to provide a light-emitting diode and a method for manufacturing a light-emitting diode in order to achieve a uniform package layer, allowing light transmitting through the package layer to have identical length of optic path thereby making white light emitting therefrom uniform.

In a first aspect, the present invention provides a light-emitting diode, which comprises: a base layer; a circuit layer, which is formed on the base layer; a light-emitting chip, which is formed on the circuit layer to form a stacked combination; electrode pads, which are formed on the base layer and are electrically connected to the light-emitting chip, the electrode pads being spaced from the stacked combination of the circuit layer and the light-emitting chip by predetermined first spacing distance so that the electrode pads and the stacked combination of the circuit layer and the light-emitting chip define therebetween first grooves, the electrode pads having an altitude that is equal to an altitude of the light-emitting chip; and a phosphor powder contained package layer, which is formed on the light-emitting chip and the electrode pads and is filled into the first grooves to form a uniform dome shape.

Optionally, the electrode pads have a height that is equal to the sum of a height of the circuit layer and a height of the light-emitting chip.

Optionally, the base layer is inwardly recessed to form a receiving trough and the receiving trough has sidewalls and a bottom on which the circuit layer is formed.

Optionally, the circuit layer has portions that are located on the sidewalls of the receiving trough and are spaced from the light-emitting chip by predetermined second spacing distances so that the portions of the circuit layer and the light-emitting chip define therebetween second grooves.

Optionally, the base layer comprises a conductive base material and an insulation layer formed on the conductive base material.

Optionally, the conductive base material comprises one of aluminum, aluminum alloy, magnesium, magnesium alloy, titanium, and titanium alloy.

Optionally, the conductive base material has a thickness of 0.1 millimeters.

Optionally, the package layer is made of a material of silicon resin or epoxy resin.

Optionally, the electrode pads and the circuit layer are made of a material of gold, aluminum, or copper.

In a second aspect, the present invention provides a method for manufacturing a light-emitting diode, which comprises: providing a base layer; forming a circuit layer and electrode pads on the base layer through coating; mounting a light-emitting chip on the circuit layer and allowing an altitude of the electrode pads to be equal to an altitude of the light-emitting chip, wherein the electrode pads are spaced from the circuit layer and the light-emitting chip by predetermined first spacing distances so that the electrode pads and the circuit layer and the light-emitting chip define therebetween first grooves; and filling a package material that contains therein a phosphor powder on the light-emitting chip and the electrode pads and into the first grooves between the electrode pads and the circuit layer so as to form a uniform dome shaped package layer.

Optionally, the electrode pads have a height that is equal to the sum of a height of the circuit layer and a height of the light-emitting chip.

Optionally, the step of providing a base layer comprises providing a base layer that is inwardly recessed to form a receiving trough; and the step of forming a circuit layer on the base layer through coating comprises forming a circuit layer the sidewalls and a bottom of the receiving trough of the base layer through coating.

Optionally, the circuit layer and the light-emitting chip are spaced from each other by second spacing distances so that the circuit layer and the light-emitting chip define therebetween second grooves.

Optionally, the step of providing a base layer comprises: providing a conductive base material; and forming an insulation layer on the conductive base material.

Optionally, the conductive base material comprises one of aluminum, aluminum alloy, magnesium, magnesium alloy, titanium, and titanium alloy.

Optionally, the conductive base material has a thickness of 0.1 millimeters.

Optionally, the package layer is made of a material of silicon resin or epoxy resin.

Optionally, the electrode pads and the circuit layer are made of a material of gold, aluminum, or copper.

Optionally, step of forming a circuit layer and electrode pads on the base layer through coating comprises: coating a conductor on the base layer through a coating process; and subjecting the conductor to corrosion so as to form the circuit layer and the electrode pad on the base layer.

Optionally, the coating of the conductor has a height between 35-300 micrometers.

In the embodiments of the present invention, first grooves are formed between the electrode pads and the circuit layer and due to the existence of the first grooves, the spreadability of the package layer is reduced so that the package layer forms a uniform dome shape, allowing light transmitting through the package layer to have identical length of optic path and white light emitting therefrom is made uniform.

BRIEF DESCRIPTION OF THE DRAWINGS

To more clearly explain the technical solutions proposed in embodiments of the present invention or those of the prior art, a brief description of the drawings that are necessary for describing the embodiments of the present invention or the prior art is given as follows. It is obvious that the drawings that will be described below show only some embodiments of the present invention. For those having ordinary skills of the art, other drawings may also be readily available from these attached drawings without the expense of creative effort and endeavor.

DETAILED DESCRIPTION OF THE PREFERRED EMBODIMENTS

A clear and complete description will be given to technical solutions of embodiments of the present invention with reference to the attached drawings of the embodiments of the present invention. However, the embodiments so described are only some, but not all, of the embodiments of the present invention. Other embodiments that are available to those having ordinary skills of the art without the expense of creative effort and endeavor are considered belonging to the scope of protection of the present invention.

Figure 1:
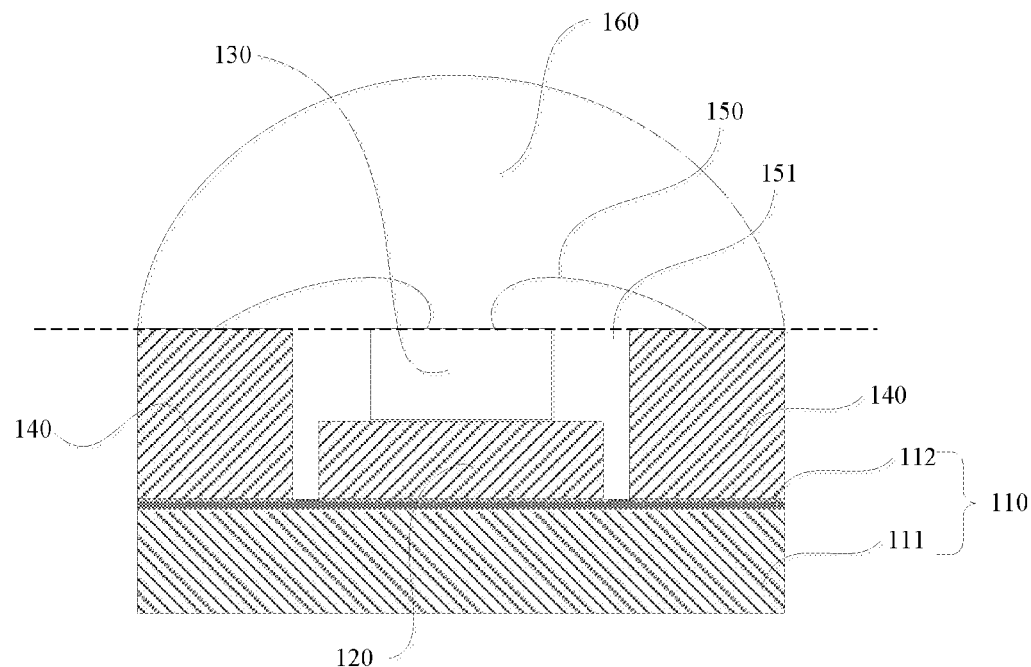
FIG. 1 is a schematic view showing a light-emitting diode according to an embodiment of the present invention.

Referring to FIG. 1, FIG. 1 is a schematic view showing a light-emitting diode according to an embodiment of the present invention. The light-emitting diode of the instant embodiment comprises: a base layer 110, a circuit layer 120, a light-emitting chip 130, electrode pads 140, conductive wires 150, and a package layer 160. The base layer 110 comprises a conductive base material 111 and an insulation layer 112. The circuit layer 120 is disposed on the insulation layer 112 and the light-emitting chip 130 is formed on the circuit layer 120. The electrode pads 140 are also disposed on the insulation layer 112 and the electrode pads 140 are spaced from the circuit layer 120 and the light-emitting chip 130 by predetermined first spacing distances, so that the electrode pads 140 and the circuit layer 120 and the light-emitting chip 130 define therebetween first grooves 151. Further, the electrode pads 140 have an altitude that is equal to altitude of the light-emitting chip 130. In a specific embodiment, the height of the electrode pads 140 is equal to the sum of a height of the circuit layer 120 and a height of the light-emitting chip 130. The conductive wires 150 electrically connect the electrode pads 140 to the light-emitting chip 130. The package layer 160 is mixed with phosphor powder. The package layer 160 is formed on the light-emitting chip 130 and the electrode pad 140 and is filled into the first grooves 51 between the electrode pads 140 and the circuit layer 120 to form a uniformly shaped dome.

The conductive base material 111 comprises a metallic material, which can be aluminum (Al), aluminum alloy (Al alloy), magnesium (Mg), magnesium alloy (Mg alloy), titanium (Ti), and titanium alloy (Ti alloy). The size and shape of the conductive base material 111 are not subject to any constraint and can be determined according to machinability and practical needs. Considering, in combination, machining operations, product reliability, and product compactness, the conductive base material 111 can be arranged to have a thickness of 0.1 millimeters.

The insulation layer 112 can be formed on the conductive base material 111 by using anodizing, plasma electrolytic oxidation (PEO), dry oxidation, or bonding process. The insulation layer 112 can be disposed on a surface of the conductive base material 111 that is adjacent to the circuit layer 120 and the electrode pads 140 or can alternatively be formed on the entirety of surface of the conductive base material 111.

A conductor is coated on the insulation layer 112 to such a thickness as to sufficiently cover the light-emitting chip 130. Then, the conductor is subjected to corrosion so as to form the circuit layer 120 and the electrode pads 140. As such, here the height of the coating of the conductor is varied according to the thickness of the light-emitting chip 130. For example, the coating of the conductor can be made to have a height of 35-300 micrometers. The covering conductor can be gold (Au), aluminum (Al), or copper (Cu).

The conductive wires 150 can be electrically conductive metal filaments, such as gold (Au) filaments, aluminum (Al) filaments, or copper (Cu) filaments.

The package layer 160 is formed by curing a transparent resin material containing therein a phosphor powder. The transparent resin material can be a silicon resin or an epoxy resin. When the transparent resin material containing the phosphor powder is injected on the light-emitting chip 130 and the electrode pads 140, the resin material flows into the first grooves 151 between the electrode pads 140 and the circuit layer 120. Further, due to the existence of the first grooves 151, spreadability of the injected resin material is reduced so that the injected resin material, after cured, forms a uniform dome shape. Thus, light transmitting through the package layer 160 would be of identical length of optic path and white light emitting therefrom is made uniform.

Figure 2:
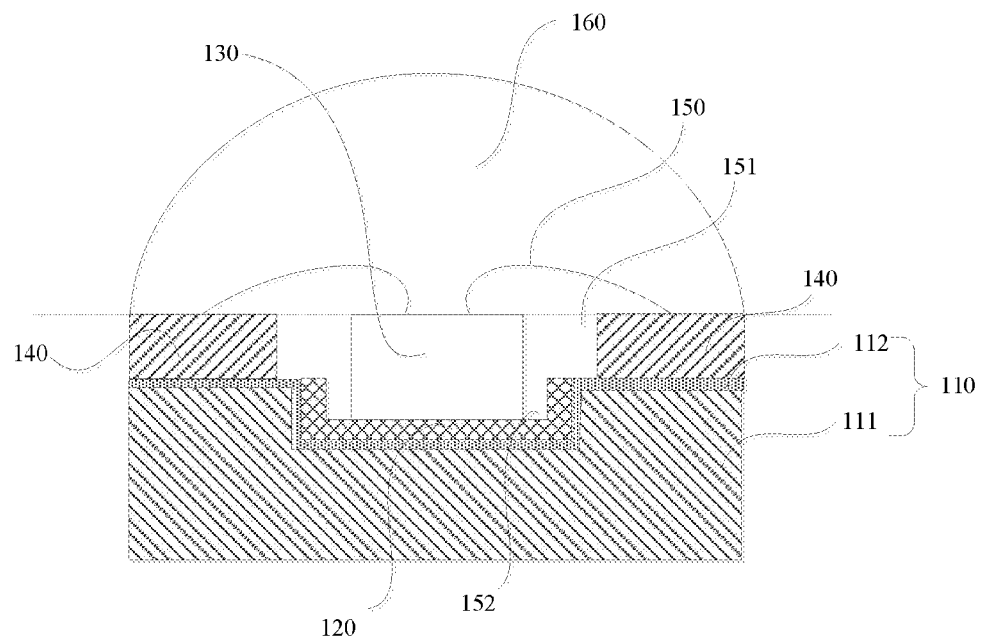
FIG. 2 is a schematic view showing a light-emitting diode according to another embodiment of the present invention.
Figure 3:
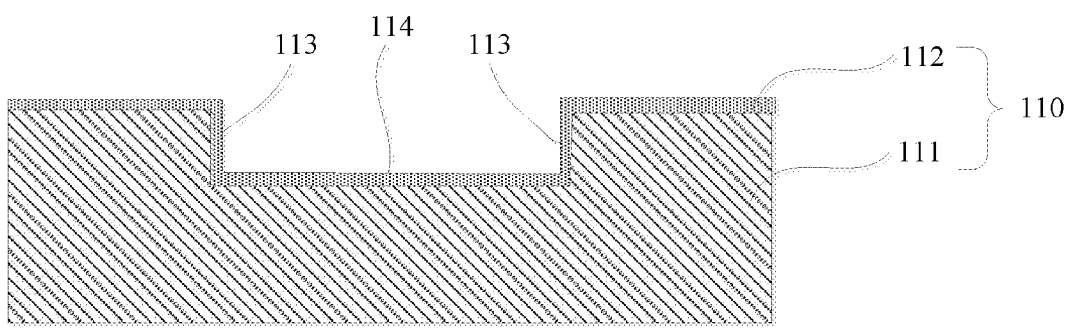
FIG. 3 is a schematic view showing a base layer according to an embodiment of the present invention.

Referring to FIG. 2, FIG. 2 is a schematic view showing a light-emitting diode according to another embodiment of the present invention. The light-emitting diode of the instant embodiment comprises: a base layer 110, a circuit layer 120, a light-emitting chip 130, electrode pads 140, conductive wires 150, and a package layer 160. Referring also to FIG. 3, the base layer 110 comprises a conductive base material 111 and an insulation layer 112. The base layer 110 is recessed inwardly to form a receiving trough. The circuit layer 120 is formed on sidewalls 113 and a bottom 114 of the receiving trough. The circuit layer 120 is arranged on the insulation layer 112 and the light-emitting chip 130 is formed on the circuit layer 120. The electrode pads 140 are also disposed on the insulation layer 112 and the electrode pads 140 are spaced from the circuit layer 120 and the light-emitting chip 130 by predetermined first spacing distances, so that the electrode pads 140 and the circuit layer 120 and the light-emitting chip 130 define therebetween first grooves 151. Further, the electrode pads 140 have an altitude that is equal to altitude of the light-emitting chip 130. The light-emitting chip 130 is spaced from the circuit layer 120 by predetermined second spacing distances, so that the light-emitting chip 130 and the circuit layer 120 define therebetween second grooves 152. The conductive wires 150 electrically connect the electrode pads 140 to the light-emitting chip 130. The package layer 160 is mixed with phosphor powder. The package layer 160 is formed on the light-emitting chip 130 and the electrode pad 140 and is filled into the first grooves 51 between the electrode pads 140 and the circuit layer 120 and the second grooves 152 between the light-emitting chip 130 and the circuit layer 120 to form a uniformly shaped dome.

The conductive base material 111 comprises a metallic material, which can be aluminum (Al), aluminum alloy (Al alloy), magnesium (Mg), magnesium alloy (Mg alloy), titanium (Ti), and titanium alloy (Ti alloy). The size and shape of the conductive base material 111 are not subject to any constraint and can be determined according to machinability and practical needs. Considering, in combination, machining operations, product reliability, and product compactness, the conductive base material 111 can be arranged to have a thickness of 0.1 millimeters. Operations, such as etching, may be applied to the conductive base material 111 so as to form a hollow cavity in the conductive base material 111.

The insulation layer 112 can be formed on the conductive base material 111 by using anodizing, plasma electrolytic oxidation (PEO), dry oxidation, or bonding process. The insulation layer 112 is disposed on a surface of the conductive base material 111 that is adjacent to the circuit layer 120 and the electrode pads 140 and can be formed on the entirety of the surface of the conductive base material 111. The insulation layer 112 covers the hollow cavity of the conductive base material 111 to form the receiving trough.

A conductor is coated on the insulation layer 112 to such a thickness as to sufficiently cover the light-emitting chip 130. Then, the conductor is subjected to corrosion so as to form the circuit layer 120 and the electrode pads 140. As such, here the height of the coating of the conductor is varied according to the thickness of the light-emitting chip 130. For example, the coating of the conductor can be made to have a height of 35-300 micrometers. The covering conductor can be gold (Au), aluminum (Al), or copper (Cu).

The conductive wires 150 can be electrically conductive metal filaments, such as gold (Au) filaments, aluminum (Al) filaments, or copper (Cu) filaments.

The package layer 160 is formed by curing a transparent resin material containing therein a phosphor powder. The transparent resin material can be a silicon resin or an epoxy resin. When the transparent resin material containing the phosphor powder is injected on the light-emitting chip 130 and the electrode pads 140, the resin material flows into the first grooves 151 between the electrode pads 140 and the circuit layer 120 and the second grooves 152 between the light-emitting chip 130 and the circuit layer 120. Further, due to the existence of the first grooves 151 and the second grooves 152, spreadability of the injected resin material is reduced so that the injected resin material, after cured, forms a uniform dome shape. Thus, light transmitting through the package layer 160 would be of identical length of optic path and white light emitting therefrom is made uniform.

Figure 4:
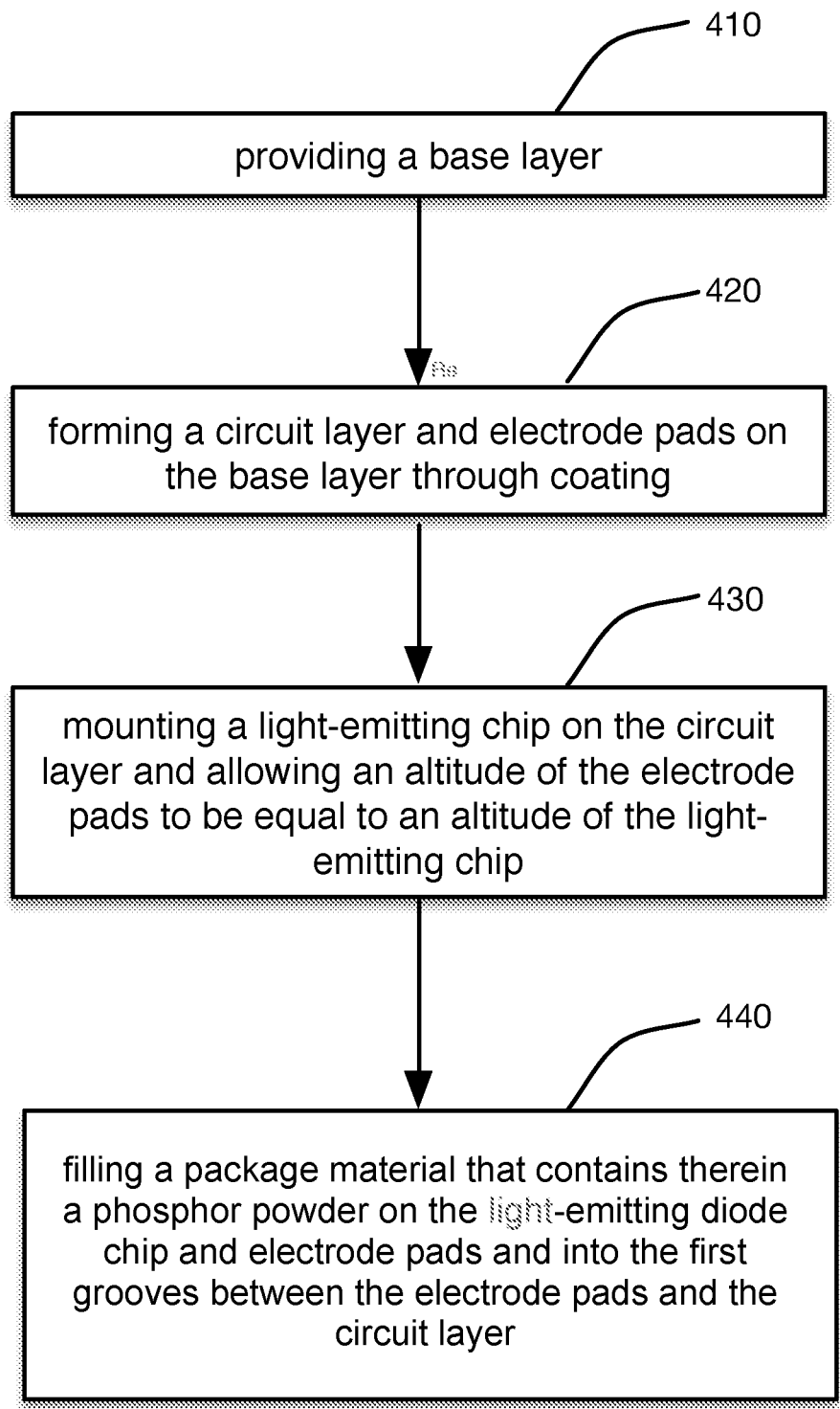
FIG. 4 is a flow chart illustrating a method for manufacturing a light-emitting diode according to an embodiment of the present invention.

Referring to FIG. 4, FIG. 4 is a flow chart illustrating a method for manufacturing a light-emitting diode according to an embodiment of the present invention. The method for manufacturing a light-emitting diode according to the instant embodiment comprises:

410: providing a base layer.

Firstly, a conductive base material suitable for making a light-emitting diode is provided, wherein the conductive base material comprises a metallic material, which can be aluminum (Al), aluminum alloy (Al alloy), magnesium (Mg), magnesium alloy (Mg alloy), titanium (Ti), and titanium alloy (Ti alloy). The size and shape of the conductive base material are not subject to any constraint and can be determined according to machinability and practical needs. Considering, in combination, machining operations, product reliability, and product compactness, the conductive base material can be arranged to have a thickness of 0.1 millimeters.

Then, anodizing, plasma electrolytic oxidation (PEO), dry oxidation, or bonding process is applied to form an insulation layer on the conductive base material. The insulation layer can be disposed on a surface of the conductive base material that is adjacent to the circuit layer and the electrode pads 140 or can alternatively be formed on the entirety of surface of the conductive base material.

420: forming a circuit layer and electrode pads on the base layer through coating.

A conductor is coated on the insulation layer to such a thickness as to sufficiently cover the light-emitting chip. Then, the conductor is subjected to corrosion so as to form the circuit layer and the electrode pads. As such, here the height of the coating of the conductor is varied according to the thickness of the light-emitting chip. For example, the coating of the conductor can be made to have a height of 35-300 micrometers. The covering conductor can be gold (Au), aluminum (Al), or copper (Cu).

430: mounting a light-emitting chip on the circuit layer and allowing an altitude of the electrode pads to be equal to an altitude of the light-emitting chip. In an embodiment, the electrode pads are made to have a height that is equal to the sum of a height of the circuit layer and a height of the light-emitting chip. The electrode pads are spaced from the circuit layer and the light-emitting chip by predetermined first spacing distances so that the electrode pads and the circuit layer and the light-emitting chip define therebetween first grooves. Connection is then achieved with leads so that the light-emitting chip and the electrode pads are electrically connected through conductive wires. The conductive wires can be electrically conductive metal filaments, such as gold (Au) filaments, aluminum (Al) filaments, or copper (Cu) filaments.

440: filling a package material that contains therein a phosphor powder on the light-emitting chip and the electrode pads and into the first grooves between the electrode pads and the circuit layer so as to form a uniform dome shaped package layer.

A transparent resin material that contains a phosphor powder is injected onto the light-emitting chip and the electrode pads to allow the resin material to flow into the first grooves between the electrode pads and the circuit layer. The transparent resin material can be a silicon resin or an epoxy resin. Due to the existence of the first grooves, spreadability of the injected resin material is reduced so that the injected resin material, after cured, forms a uniform dome shape. Thus, light transmitting through the package layer would be of identical length of optic path and white light emitting therefrom is made uniform.

Figure 5:
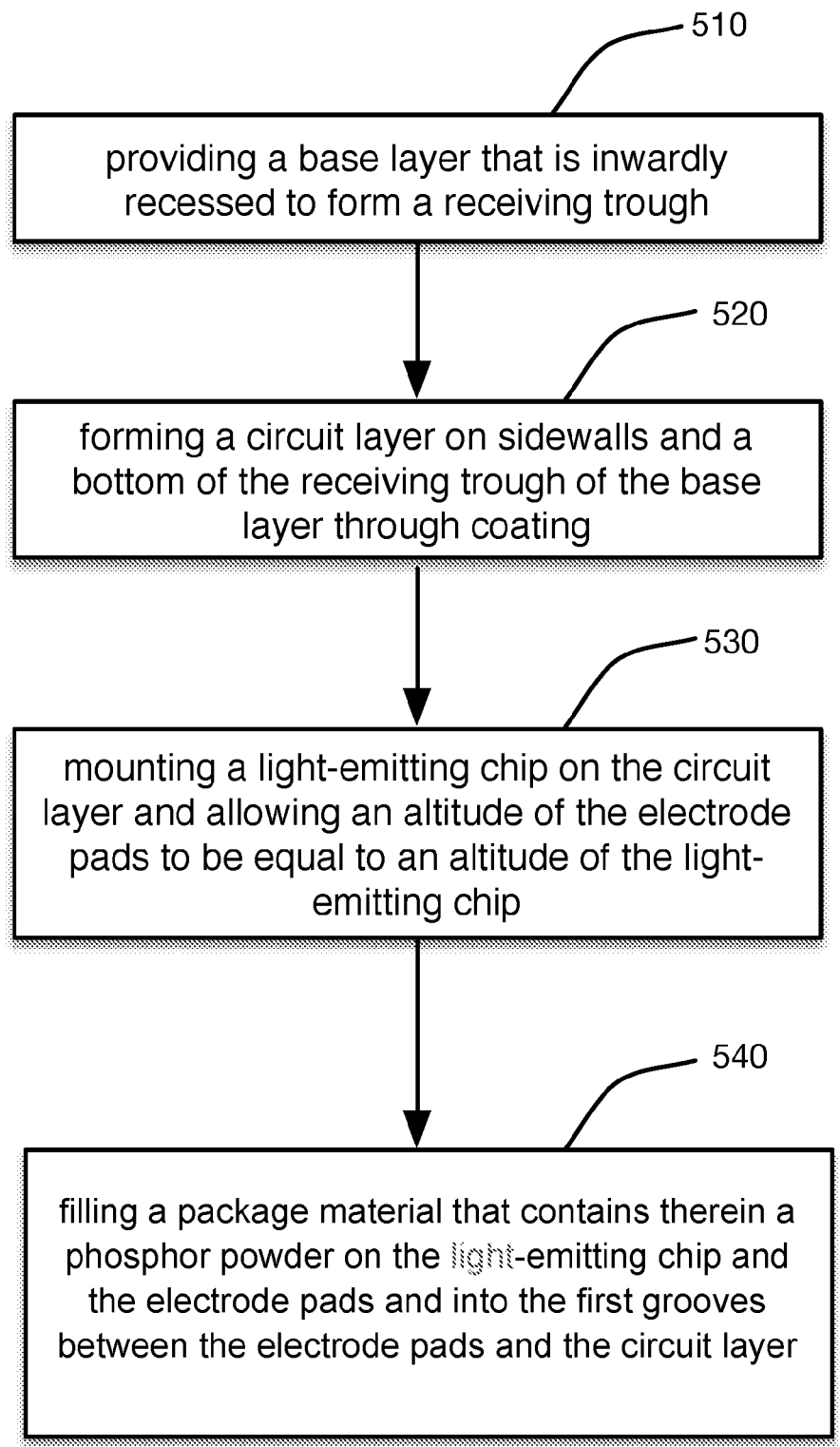
FIG. 5 is a flow chart illustrating a method for manufacturing a light-emitting diode according to another embodiment of the present invention.

Referring to FIG. 5, FIG. 5 is a flow chart illustrating a method for manufacturing a light-emitting diode according to another embodiment of the present invention. The method for manufacturing a light-emitting diode according to the instant embodiment comprises:

510: providing a base layer that is recessed inwardly to form a receiving trough.

Firstly, a conductive base material suitable for making a light-emitting diode is provided, wherein the conductive base material comprises a metallic material, which can be aluminum (Al), aluminum alloy (Al alloy), magnesium (Mg), magnesium alloy (Mg alloy), titanium (Ti), and titanium alloy (Ti alloy). The size and shape of the conductive base material are not subject to any constraint and can be determined according to machinability and practical needs. Considering, in combination, machining operations, product reliability, and product compactness, the conductive base material can be arranged to have a thickness of 0.1 millimeters. Operations, such as etching, may be applied to the conductive base material so as to form a hollow cavity in the conductive base material.

Then, anodizing, plasma electrolytic oxidation (PEO), dry oxidation, or bonding process is applied to form an insulation layer on the conductive base material. The insulation layer can be disposed on a surface of the conductive base material that is adjacent to the circuit layer and the electrode pads 140 or can alternatively be formed on the entirety of surface of the conductive base material. The insulation layer covers the hollow cavity of the conductive base material to form the receiving trough.

520: forming a circuit layer on sidewalls and a bottom of the receiving trough of the base layer through coating.

A conductor is coated on the insulation layer to such a thickness as to sufficiently cover the light-emitting chip. Then, the conductor is subjected to corrosion so as to form the circuit layer and the electrode pads. The circuit layer is formed on the sidewalls and the bottom of the receiving trough. As such, here the height of the coating of the conductor is varied according to the thickness of the light-emitting chip. For example, the coating of the conductor can be made to have a height of 35-300 micrometers. The covering conductor can be gold (Au), aluminum (Al), or copper (Cu).

530: mounting a light-emitting chip on the circuit layer and allowing an altitude of the electrode pads to be equal to an altitude of the light-emitting chip. In an embodiment, the electrode pads are made to have a height that is equal to the sum of a height of the circuit layer and a height of the light-emitting chip. The electrode pads are spaced from the circuit layer and the light-emitting chip by predetermined first spacing distances so that the electrode pads and the circuit layer and the light-emitting chip define therebetween first grooves. The circuit layer and the light-emitting chip are spaced from each other by predetermined second spacing distances, so that the circuit layer and the light-emitting chip define therebetween second grooves. Connection is then achieved with leads so that the light-emitting chip and the electrode pads are electrically connected through conductive wires. The conductive wires can be electrically conductive metal filaments, such as gold (Au) filaments, aluminum (Al) filaments, or copper (Cu) filaments.

540: filling a package material that contains therein a phosphor powder on the light-emitting chip and the electrode pads and into the first grooves between the electrode pads and the circuit layer so as to form a uniform dome shaped package layer.

A transparent resin material that contains a phosphor powder is injected onto the light-emitting chip and the electrode pads to allow the resin material to flow into the first grooves between the electrode pads and the circuit layer and the second grooves between the light-emitting chip and the circuit layer. The transparent resin material can be a silicon resin or an epoxy resin. Due to the existence of the first grooves and the second grooves, spreadability of the injected resin material is reduced so that the injected resin material, after cured, forms a uniform dome shape. Thus, light transmitting through the package layer would be of identical length of optic path and white light emitting therefrom is made uniform.

In the embodiments of the present invention, first grooves are formed between the electrode pads and the circuit layer and due to the existence of the first grooves, the spreadability of the package layer is reduced so that the package layer forms a uniform dome shape, allowing light transmitting through the package layer to have identical length of optic path and white light emitting therefrom is made uniform.

Those having ordinary skills of the art may appreciate that all or some of the process of the embodiments discussed above can be achieved with hardware through instructions given by computer procedures. Such procedures can be stored in a computer readable storage medium so that execution of the procedures may include the processes of the embodiments discussed above. The storage medium can be a magnetic disk, an optic disk, a read-only memory (ROM), or a random access memory (RAM).

Disclosed above is only one preferred embodiment of the present invention, which does not impose undue constraints to the scope of protection of the present invention. Those having ordinary skills of the art may readily appreciate that equivalent modifications that allow for realization of all or part of the operation process of the preferred embodiment described above and comply with the requirement defined in the appended claims are considered within the protection scope covered by the present invention.

What is claimed is:

1. A light-emitting diode, comprising:
a base layer;
a circuit layer, which is formed on the base layer;
a light-emitting chip, which is formed on the circuit layer to form a stacked combination;
electrode pads, which are formed on the base layer and are electrically connected to the light-emitting chip, the electrode pads being spaced from the stacked combination of the circuit layer and the light-emitting chip by predetermined first spacing distance so that the electrode pads and the stacked combination of the circuit layer and the light-emitting chip define therebetween first grooves, the electrode pads having an altitude that is equal to an altitude of the light-emitting chip; and
a phosphor powder contained package layer, which is formed on the light-emitting chip and the electrode pads and is filled into the first grooves to form a uniform dome shape.

2. The light-emitting diode as claimed in claim 1, wherein the electrode pads have a height that is equal to the sum of a height of the circuit layer and a height of the light-emitting chip.

3. The light-emitting diode as claimed in claim 1, wherein the base layer is inwardly recessed to form a receiving trough, the receiving trough having sidewalls and a bottom on which the circuit layer is formed.

4. The light-emitting diode as claimed in claim 3, wherein the circuit layer has portions that are located on the sidewalls of the receiving trough and are spaced from the light-emitting chip by predetermined second spacing distances so that the portions of the circuit layer and the light-emitting chip define therebetween second grooves.

5. The light-emitting diode as claimed in claim 1, wherein the base layer comprises a conductive base material and an insulation layer formed on the conductive base material.

6. The light-emitting diode as claimed in claim 5, wherein the conductive base material comprises one of aluminum, aluminum alloy, magnesium, magnesium alloy, titanium, and titanium alloy.

7. The light-emitting diode as claimed in claim 5, wherein the conductive base material has a thickness of 0.1 millimeters.

8. The light-emitting diode as claimed in claim 1, wherein the package layer is made of a material of silicon resin or epoxy resin.

9. The light-emitting diode as claimed in claim 1, wherein the electrode pads and the circuit layer are made of a material of gold, aluminum, or copper.

\* \* \* \* \*